(12) United States Patent
Nakata et al.

(10) Patent No.: US 8,435,417 B2
(45) Date of Patent: May 7, 2013

(54) METHOD OF MANUFACTURING SEMICONDUCTOR DEVICE

(75) Inventors: Kazunari Nakata, Chiyoda-ku (JP);
Kaoru Motonami, Chiyoda-ku (JP);
Atsushi Narazaki, Chiyoda-ku (JP);
Ayumu Onoyama, Chiyoda-ku (JP);
Shigeto Honda, Chiyoda-ku (JP);
Ryoichi Fujii, Chiyoda-ku (JP); Tomoya Hirata, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 269 days.

(21) Appl. No.: 12/827,259

(22) Filed: Jun. 30, 2010

(65) Prior Publication Data

US 2011/0059612 A1  Mar. 10, 2011

(30) Foreign Application Priority Data

Sep. 8, 2009  (JP) ................ 2009-207071

(51) Int. Cl.
*B44C 1/22* (2006.01)
(52) U.S. Cl.
USPC ............................................. 216/52; 216/92
(58) Field of Classification Search .......... 216/52, 216/92
See application file for complete search history.

(56) References Cited

U.S. PATENT DOCUMENTS

| 5,851,928 | A * | 12/1998 | Cripe et al. | 438/748 |
| 6,520,844 | B2 * | 2/2003 | Iwasaki et al. | 451/285 |
| 2002/0026985 | A1 | 3/2002 | Kai | |
| 2006/0292887 | A1 | 12/2006 | Hara | |

FOREIGN PATENT DOCUMENTS

| DE | 101 39 743 A1 | 4/2002 |
| DE | 102 58 508 B3 | 9/2004 |
| JP | 2003-59878 | 2/2003 |
| JP | 2007-335659 | 12/2007 |
| JP | 2008-311513 | 12/2008 |
| JP | 2009-94335 | 4/2009 |
| KR | 2002-0002785 | 1/2002 |
| KR | 2002-0017929 | 3/2002 |
| KR | 10-0424421 | 6/2004 |

OTHER PUBLICATIONS

U.S. Appl. No. 13/231,198, filed Sep. 13, 2011, Nakata, et al.
Notice of Allowance issued Mar. 30, 2012 in Korean patent application No. 10-2010-0085211 with English translation.
German Office Action issued Feb. 28, 2012 in patent application No. 10 2010 040 441.1 with English translation.
U.S. Appl. No. 12/981,796, filed Dec. 30, 2010. Nakata.

* cited by examiner

*Primary Examiner* — Roberts Culbert
(74) *Attorney, Agent, or Firm* — Oblon, Spivak, McClelland, Maier & Neustadt, L.L.P.

(57) ABSTRACT

A passivation film having a predetermined width from an outer peripheral end portion toward an inner side and extending along the outer peripheral end portion is formed on a front surface of a semiconductor substrate. An outer peripheral end surface orthogonal to the front surface and a rear surface is formed by grinding the outer peripheral end portion of the semiconductor substrate. A thickness of the semiconductor substrate is reduced to a predetermined thickness by grinding the rear surface. The ground rear surface is etched by discharging a mixed acid onto the rear surface while rotating the semiconductor substrate with the rear surface facing upward, to remove a fracture layer. Thereby, chipping or cracking of the semiconductor substrate is suppressed.

5 Claims, 10 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and in particular, to a method of manufacturing a semiconductor device applied to a power device.

2. Description of the Background Art

In semiconductor devices, implementing a higher-density package by three-dimensional mounting or the like has been developed. Accordingly, reduction of a thickness of a wafer has been required, and the thickness of a wafer at the time of completion of a process for a semiconductor device has been reduced to a thickness of about 25 µm.

Semiconductor devices include power devices such as an IGBT (Insulated Gate Bipolar Transistor) and an MOSFET (Metal Oxide Semiconductor Field Effective Transistor). These power devices (power semiconductor devices) are widely used, for example, as an inverter circuit for an industrial motor, an automotive motor, or the like, a power supply device for a large-capacity server, or a semiconductor switch for an uninterruptible power supply device or the like.

In such a power semiconductor device, a semiconductor substrate is worked to be thin to improve energization characteristics represented by ON characteristics and the like. In recent years, an ultra-thin semiconductor substrate based on an FZ (Floating Zone) wafer has been used to improve cost and characteristic aspects. For example, in an IGBT with a withstand voltage of 600 V, it is necessary to reduce the thickness of a semiconductor substrate to about 60 to 70 µm.

Generally, a semiconductor substrate is worked to be thin by back grinding, polishing with a polish, or mechanical polishing. When a semiconductor substrate is worked to be thin by such a technique, distortion occurs in the semiconductor substrate. Therefore, to remove a portion where distortion occurs, wet etching treatment or dry etching treatment is performed on a rear surface of the semiconductor substrate.

Further, since it is necessary to form an implantation layer and rear surface electrodes on a rear surface of a semiconductor substrate in the power semiconductor device, ion implantation treatment, sputtering treatment, and heat treatment are performed on the rear surface of the semiconductor substrate. However, since such treatment is performed after working the semiconductor substrate to be thin, there is a problem that the semiconductor substrate is likely to crack during the treatment.

To suppress cracking of a semiconductor substrate as described above, for example, Japanese Patent Laying-Open No. 2007-335659 proposes a technique of increasing the strength of a semiconductor substrate by providing a level difference (thickness) on a rear surface of an outer peripheral end portion of the semiconductor substrate.

With this technique, however, when wet etching treatment is performed on the rear surface of the semiconductor substrate to remove work distortion due to grinding or the like, a chemical solution may be scattered by the level difference at the outer peripheral end portion. Further, when the semiconductor substrate is attached to a dicing frame in the step of dicing a wafer into individual chips, air bubbles may enter between the semiconductor substrate and a tape. Furthermore, there is also a possibility that rear surface electrodes made of aluminum formed on the rear surface of the semiconductor substrate may be eroded when the level difference is removed, or that the yield of chips obtained may be decreased by providing the level difference.

In addition, reasons for causing the semiconductor substrate to crack easily include, in particular, that the outer peripheral end portion of the semiconductor substrate becomes like the edge of a knife. Since the outer peripheral end portion of the semiconductor substrate is generally chamfered to have a cross section in the shape of a portion of an ellipse, the outer peripheral portion of the semiconductor substrate becomes like the edge of a knife when the semiconductor substrate is worked to be thin by polishing or the like, and thus the edge portion is likely to chip or crack.

To suppress chipping or the like of an outer peripheral end portion of a semiconductor substrate as described above, Japanese Patent Laying-Open No. 2003-059878 proposes a technique of polishing an outer peripheral end portion of a semiconductor substrate. In this case, however, the outer peripheral end portion of the semiconductor substrate may be etched like the edge of a knife again by wet etching for removing work distortion, as described below.

Specifically, to remove work distortion caused in the semiconductor substrate by a back grinding step when the thickness of the semiconductor substrate is reduced, a stress relief step is required. In the stress relief step, wet etching treatment with a chemical solution using nitric-hydrofluoric acid is performed on a rear surface of the semiconductor substrate.

On this occasion, nitric-hydrofluoric acid may reach a front surface side of the outer peripheral end portion from the rear surface of the semiconductor substrate. Thus, the front surface side of the outer peripheral end portion of the semiconductor substrate is etched with the reaching nitric-hydrofluoric acid, and the outer peripheral end portion of the semiconductor substrate becomes like the edge of a knife again. This has caused a problem that the outer peripheral end portion of the semiconductor substrate is likely to chip or crack.

SUMMARY OF THE INVENTION

The present invention has been made to solve the above-mentioned problems, and one object of the present invention is to provide a method of manufacturing a semiconductor device that suppresses chipping or cracking of a semiconductor substrate.

A method of manufacturing a semiconductor device in accordance with the present invention includes the steps of: forming a protective film having a predetermined width from an outer peripheral end portion toward an inner side of a semiconductor substrate and extending along the outer peripheral end portion, on a first main surface of the semiconductor substrate having the first main surface and a second main surface facing each other; forming an outer peripheral end surface orthogonal to the first main surface and the second main surface by grinding the outer peripheral end portion of the semiconductor substrate; reducing a thickness of the semiconductor substrate to a predetermined thickness by grinding the second main surface of the semiconductor substrate; and etching the ground second main surface by discharging a predetermined chemical solution onto the second main surface while rotating the semiconductor substrate with the second main surface facing upward.

Another method of manufacturing a semiconductor device in accordance with the present invention includes the steps of: preparing a semiconductor substrate having a first main surface and a second main surface facing each other, with an outer peripheral end portion having been ground; forming a protective film having a predetermined width from the outer peripheral end portion toward an inner side of the semiconductor substrate and extending along the outer peripheral end portion, on the first main surface of the semiconductor substrate; reducing a thickness of the semiconductor substrate to a predetermined thickness by grinding the second main surface of the semiconductor substrate; and etching the ground second main surface by discharging a predetermined chemical solution onto the second main surface while rotating the semiconductor substrate with the second main surface facing upward.

According to the former method of manufacturing a semiconductor device in accordance with the present invention, a protective film having a predetermined width from an outer peripheral end portion toward an inner side of a semiconductor substrate and extending along the outer peripheral end portion is formed on a first main surface of the semiconductor substrate. Thereby, when the ground second main surface is etched by discharging a predetermined chemical solution onto the second main surface with the second main surface facing upward, even if the chemical solution reaches the first main surface side of the outer peripheral end portion, the protective film extending along the outer peripheral end portion prevents the first main surface side from being etched. As a result, the outer peripheral end portion of the semiconductor substrate is inhibited from becoming like the edge of a knife, and chipping or cracking of the semiconductor substrate can be suppressed.

According to the latter method of manufacturing a semiconductor device in accordance with the present invention, a protective film having a predetermined width from an outer peripheral end portion toward an inner side of a semiconductor substrate and extending along the outer peripheral end portion is formed on a first main surface of the semiconductor substrate. Thereby, when the ground second main surface is etched by discharging a predetermined chemical solution onto the second main surface with the second main surface facing upward, even if the chemical solution reaches the first main surface side of the outer peripheral end portion, the first main surface side is prevented from being etched. As a result, the outer peripheral end portion of the semiconductor substrate is inhibited from becoming like the edge of a knife, and chipping or cracking of the semiconductor substrate can be suppressed. Further, since a semiconductor substrate with an outer peripheral end portion having been ground is prepared from the beginning, there is no need to grind the outer peripheral end portion of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
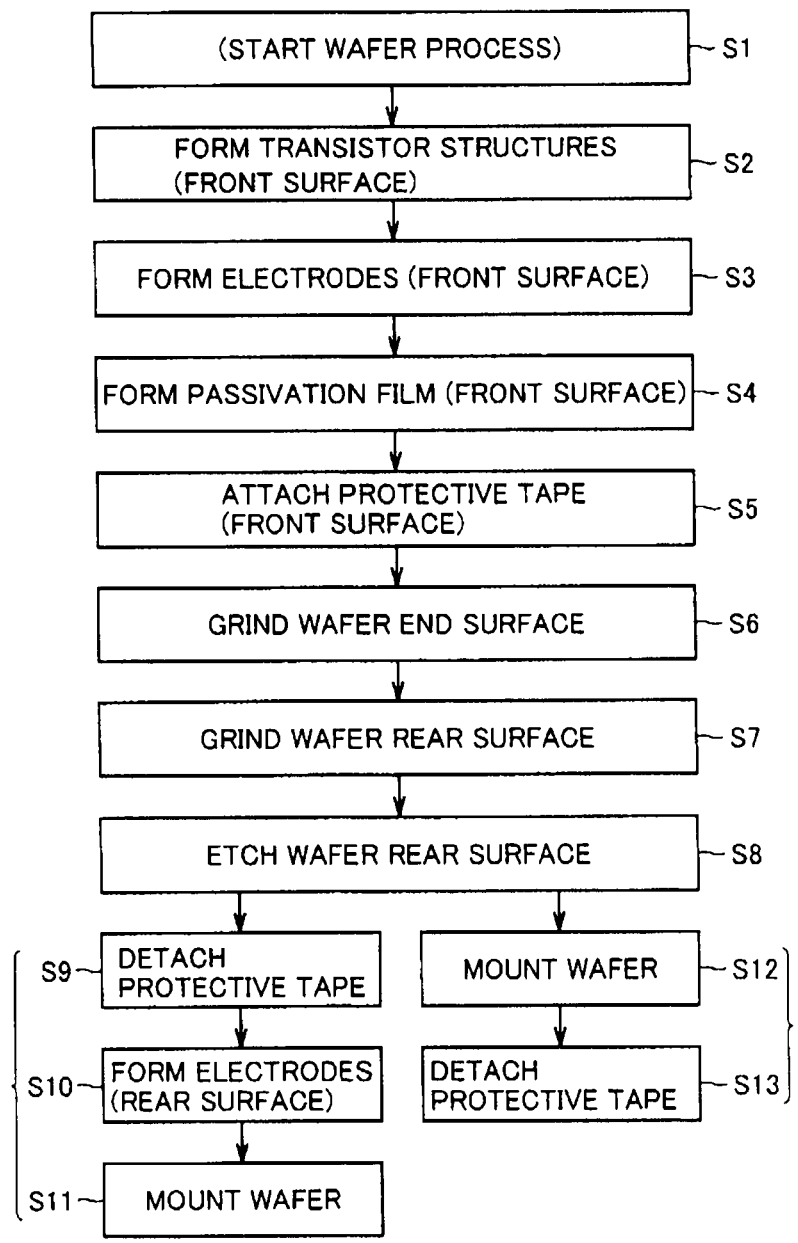
FIG. 1 is a flowchart illustrating a manufacturing flow of a semiconductor device in accordance with an embodiment of the present invention.
Figure 2:
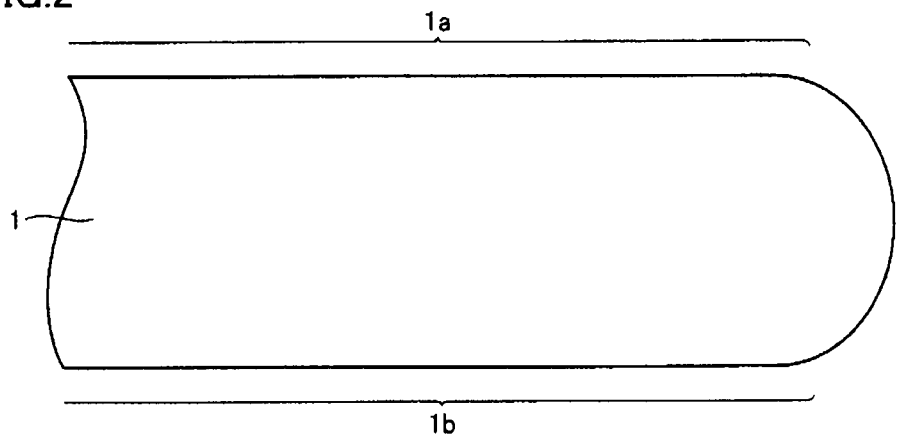
FIG. 2 is a partial cross sectional view showing a step of a method of manufacturing the semiconductor device in the embodiment.

A method of manufacturing a semiconductor device in accordance with an embodiment of the present invention will be described. FIG. 1 shows a manufacturing flow of the semiconductor device. As shown in FIG. 1, firstly in step S1, a new semiconductor substrate (wafer) is prepared to start a wafer process. As shown in FIG. 2, at the time of starting a wafer process, an outer peripheral end portion of a semiconductor substrate 1 has a cross section in the shape of a portion of a circle or a portion of an ellipse.

Figure 3:
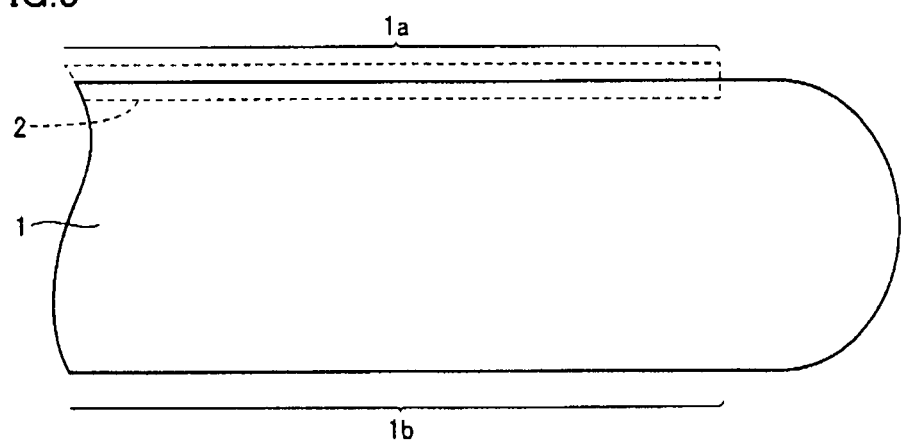
FIG. 3 is a partial cross sectional view showing a step performed after the step shown in FIG. 2 in the embodiment.

Next, in step S2, as shown in FIG. 3, insulated gate structures, transistor devices, and the like are formed on a front surface 1a of semiconductor substrate 1 (within a dotted line frame 2) through a predetermined process. Then, in step S3, electrodes are formed in a predetermined region of front surface 1a of semiconductor substrate 1 (within dotted line frame 2). The electrodes are formed, for example, by forming an electrode material such as aluminum on front surface 1a of semiconductor substrate 1 and performing predetermined patterning.

Figure 4:
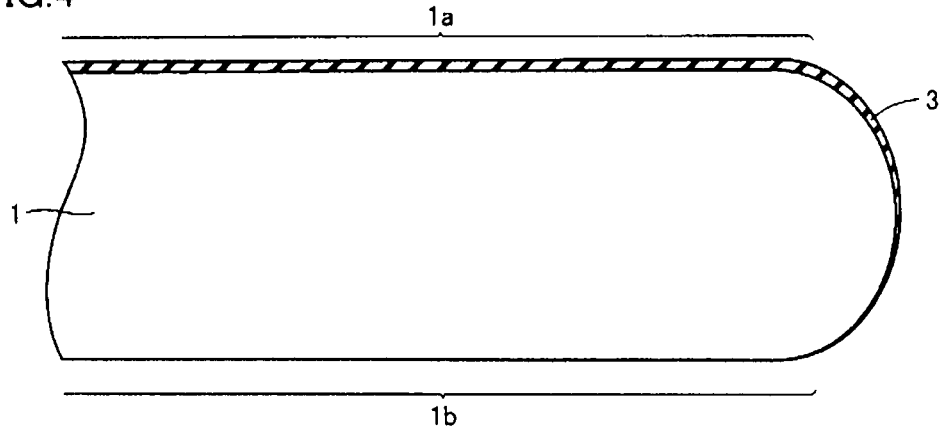
FIG. 4 is a partial cross sectional view showing a step performed after the step shown in FIG. 3 in the embodiment.

Subsequently, in step S4, a passivation film is formed. As shown in FIG. 4, a passivation film 3 is formed to electrically or mechanically protect front surface 1a of semiconductor substrate 1 on which the transistor devices and the like are formed. As passivation film 3, for example, a pattern made of a nitride such as a silicon nitride film, polyimide, or the like is formed.

On this occasion, since the front surface electrodes made of aluminum or the like are formed on front surface 1a of semiconductor substrate 1, treatment under a relatively high temperature cannot be performed. Therefore, to form a nitride, the nitride is firstly formed on front surface 1a of semiconductor substrate 1 by so-called Chemical Vapor Deposition (CVD). Next, a desired pattern is transferred onto a resist by photoengraving treatment, and the resist is left in a region of about 3 mm at an outer peripheral portion of semiconductor substrate 1 by peripheral exposure.

Figure 5:
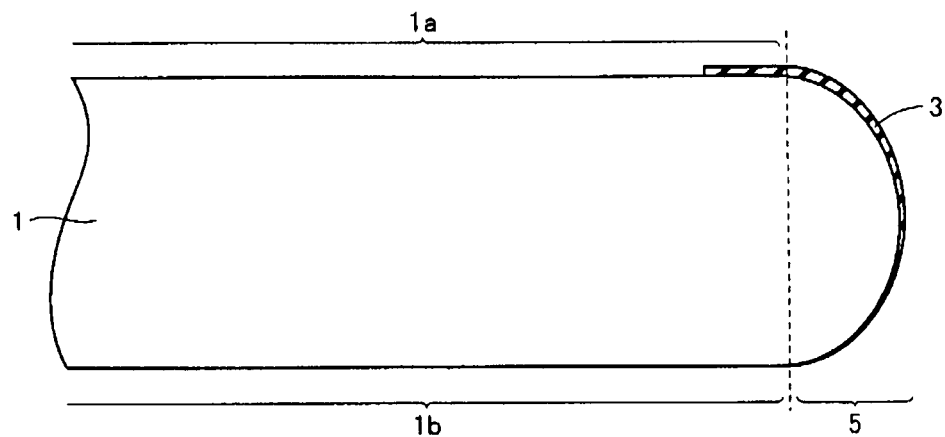
FIG. 5 is a partial cross sectional view showing a step performed after the step shown in FIG. 4 in the embodiment.

Subsequently, dry etching treatment or wet etching treatment is performed on the nitride using the resist as a mask, and thereby the passivation film having a desired pattern is formed. As shown in FIG. 5, the region at the outer peripheral end portion of semiconductor substrate 1 (front surface) is covered with passivation film 3.

If a polyimide film is formed as a passivation film, a polyimide film having a desired pattern may be formed by photoengraving and etching, as in the case of the nitride. Further, a passivation film can also be formed using a photosensitive polyimide. Furthermore, as a passivation film, a protective pattern of a polyimide film may be formed by screen printing.

Next, in step S5, a protective tape 13 (see FIG. 9) is attached to front surface 1a of semiconductor substrate 1. Protective tape 13 is attached to prevent the transistor devices and the like and circuits formed on front surface 1a from being soiled by grinding of the wafer or the like, and to prevent semiconductor substrate 1 from being cracked during grinding of semiconductor substrate 1 described later by stress concentration resulting from asperities due to such transistor devices and the like and circuits.

Figure 6:
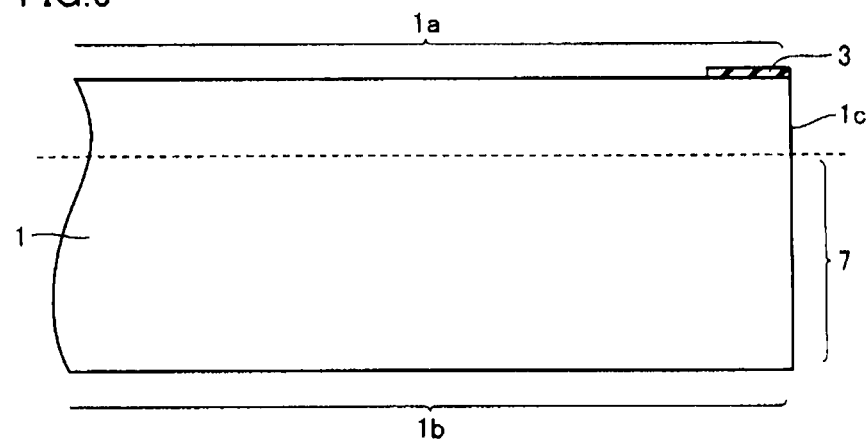
FIG. 6 is a partial cross sectional view showing a step performed after the step shown in FIG. 5 in the embodiment.

Then, in step S6, the outer peripheral end portion of the semiconductor substrate (wafer) is ground. As shown in FIG. 5, a portion indicated by a grinding width 5 is ground from the outer peripheral end portion of semiconductor substrate 1, making an outer peripheral end surface 1c of semiconductor substrate 1 substantially perpendicular to front surface 1a (a rear surface 1b) as shown in FIG. 6. Grinding width 5 is set to be not more than about 0.5 mm, although depending on the original shape of the semiconductor substrate. On front surface 1a of semiconductor substrate 1, passivation film 3 having a predetermined width from the outer peripheral end portion toward an inner side and extending along the outer peripheral end portion is left. It is desirable that the width of the passivation film is set to be not more than 5 mm from the outer peripheral end portion.

Figure 7:
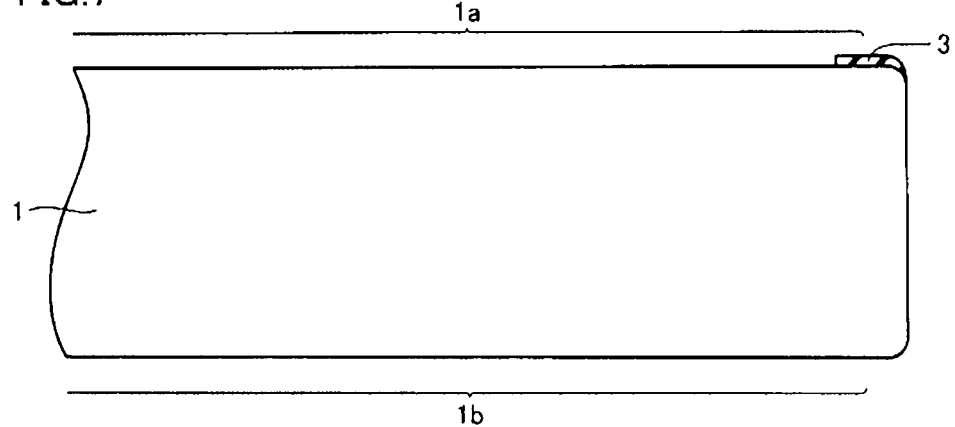
FIG. 7 is a partial cross sectional view showing a step of a manufacturing method in a case where a semiconductor substrate in accordance with a variation is used in the embodiment.

It is to be noted that, as the semiconductor substrate, semiconductor substrate 1 in which the outer peripheral end portion has been originally chamfered as shown in FIG. 7 may be applied. By applying such a semiconductor substrate, the outer peripheral end portion of the semiconductor substrate is prevented from becoming like the edge of a knife when the rear surface is ground, and thus there is no need to grind the outer peripheral end portion of the semiconductor substrate.

Figure 8:
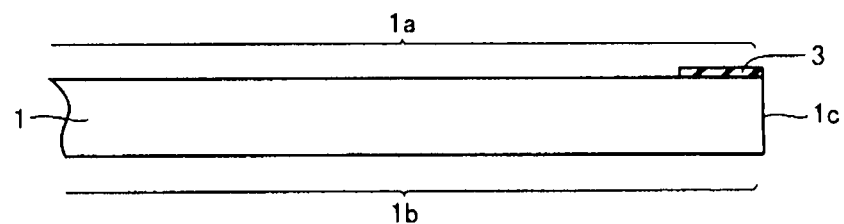
FIG. 8 is a partial cross sectional view showing a step performed after the step shown in FIG. 6 in the embodiment.

Subsequently, in step S7, rear surface 1b of semiconductor substrate (wafer) 1 is ground. As shown in FIG. 6, a portion indicated by a thickness 7 is ground from rear surface 1b of semiconductor substrate 1, and the thickness of semiconductor substrate 1 is reduced to a desired thickness as shown in FIG. 8.

Next, in step S8, wet etching treatment is performed on rear surface 1b of semiconductor substrate (wafer) 1. The rear surface of semiconductor substrate 1 is ground with a grindstone. Therefore, a fracture layer is formed on rear surface 1b of semiconductor substrate 1 by mechanical grinding. The fracture layer is a layer in which the crystal structure of monocrystalline silicon is broken by the stress exerted on semiconductor substrate 1 from the grindstone and the like and changed to be an amorphous layer or the like, and has a thickness of several μm to about 10 μm. As a technique to remove the fracture layer, there is a technique to remove it by performing wet etching treatment using a mixed acid containing hydrofluoric acid and nitric acid.

Figure 9:
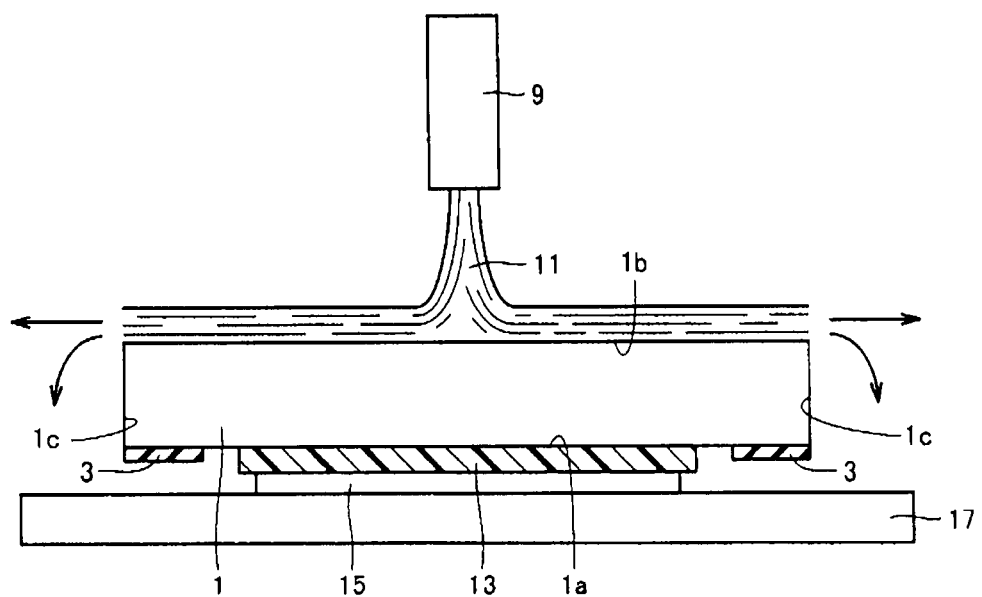
FIG. 9 is a partial cross sectional view showing a step performed after the step shown in FIG. 8 in the embodiment.

As shown in FIG. 9, firstly, semiconductor substrate 1 is suctioned to a wafer suction portion 15 provided on a chuck stage 17, with surface protective tape 13 being attached to front surface 1a. Then, chuck stage 17 starts rotating and reaches a predetermined rotation speed, and thereafter a mixed acid 11 is discharged from a chemical solution discharge nozzle 9 toward rear surface 1b of semiconductor substrate 1. It is to be noted that, during etching treatment, chemical solution discharge nozzle 9 may be swung to discharge the mixed acid evenly onto rear surface 1b of semiconductor substrate 1.

The mixed acid discharged onto rear surface 1b of semiconductor substrate 1 flows toward the outer peripheral end portion of semiconductor substrate 1 by centrifugal force, and is collected by a predetermined collection technique. A portion of the mixed acid flowing toward the outer peripheral end portion of semiconductor substrate 1 may reach front surface 1a side of the outer peripheral end portion of semiconductor substrate 1 without being scattered, due to surface tension and gravity thereof. On this occasion, since passivation film 3 is left on front surface 1a side of the outer peripheral end portion of semiconductor substrate 1, front surface 1a side can be suppressed from being etched with the mixed acid, which will be described later in detail. The semiconductor substrate from which the fracture layer has been removed using the mixed acid is detached from wafer suction portion 15 and forwarded to a next step.

As shown in FIG. 1, the next step has, for example, two flows, depending on the type of the semiconductor device. In one flow, the protective tape attached to the front surface of the semiconductor substrate is detached (in step S9), and rear surface electrodes are formed on the rear surface of the semiconductor substrate (in step S10). Thereafter, the semiconductor substrate is mounted on a predetermined member (in step S11) and completed as a power device. In the other flow, the semiconductor substrate is mounted on a predetermined member (in step S12), and thereafter the protective tape attached to the front surface of the semiconductor substrate is detached (in step S13) and completed as a power device.

In the method of manufacturing a semiconductor device described above, since passivation film 3 is left on the front surface side of the outer peripheral end portion of semiconductor substrate 1, passivation film 3 can suppress front surface 1a side of the outer peripheral end portion of semiconductor substrate 1 from being etched with the mixed acid when the fracture layer is removed using the mixed acid. This will be described in relation to a comparative example.

Figure 10:
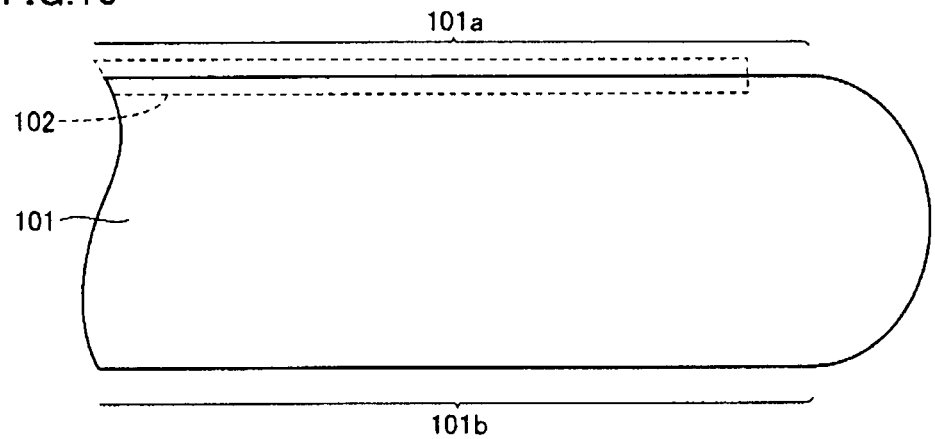
FIG. 10 is a partial cross sectional view showing a step of a method of manufacturing a semiconductor device in accordance with a comparative example.

In a method of manufacturing a semiconductor device in accordance with a comparative example, firstly, as shown in FIG. 10, insulated gate structures, transistor devices, electrodes, and the like are formed on a front surface 101a of a semiconductor substrate 101 (within a dotted line frame 102) through a predetermined process.

Figure 11:
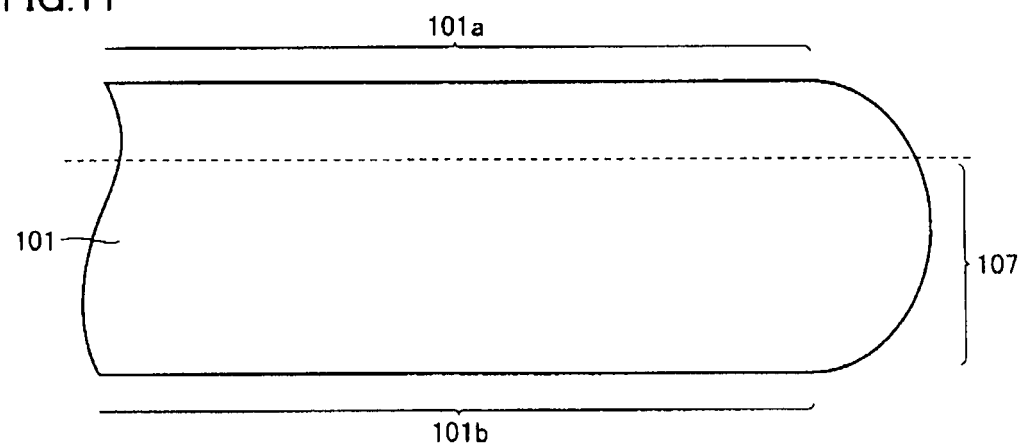
FIG. 11 is a partial cross sectional view showing a case where a rear surface is ground without grinding an outer peripheral end portion as a step performed after the step shown in FIG. 10.
Figure 12:
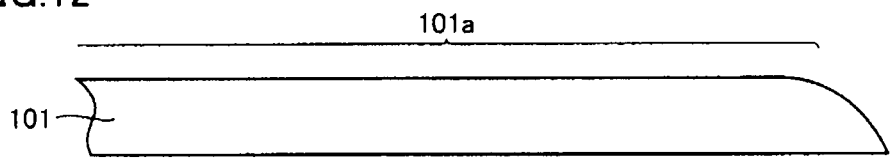
FIG. 12 is a partial cross sectional view showing a step performed after the step shown in FIG. 11.
Figure 13:
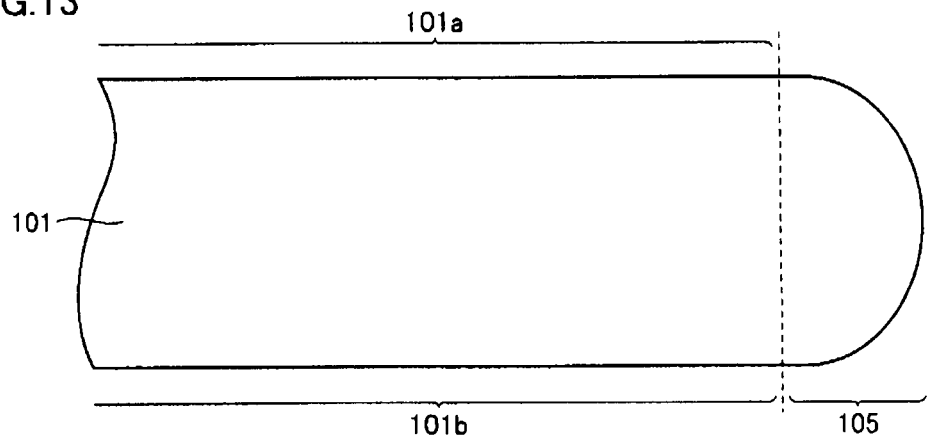
FIG. 13 is a partial cross sectional view showing a step in a case where an outer peripheral end portion is ground as a step performed after the step shown in FIG. 10.

Here, in the semiconductor substrate with an outer peripheral end portion having a cross section in the shape of a circle or the like, if a rear surface 101b of semiconductor substrate 101 is ground without grinding the outer peripheral end portion as shown in FIG. 11, the outer peripheral end portion of semiconductor substrate 101 becomes sharp like the edge of a knife as shown in FIG. 12, and chipping or cracking of semiconductor substrate 101 is likely to occur. Therefore, a portion indicated by a grinding width 105 is ground from the outer peripheral end portion of semiconductor substrate 101 as shown in FIG. 13, making an outer peripheral end surface 101c of semiconductor substrate 101 substantially perpendicular to the front surface as shown in FIG. 14.

Figure 14:
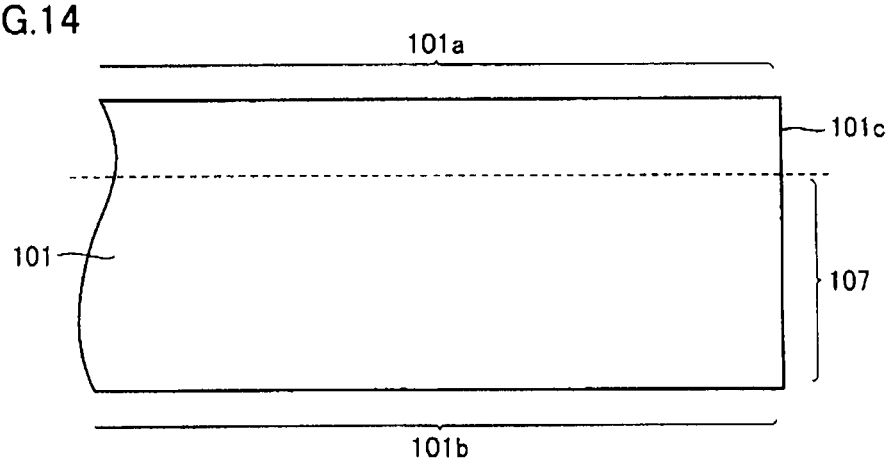
FIG. 14 is a partial cross sectional view showing a step performed after the step shown in FIG. 13.
Figure 15:
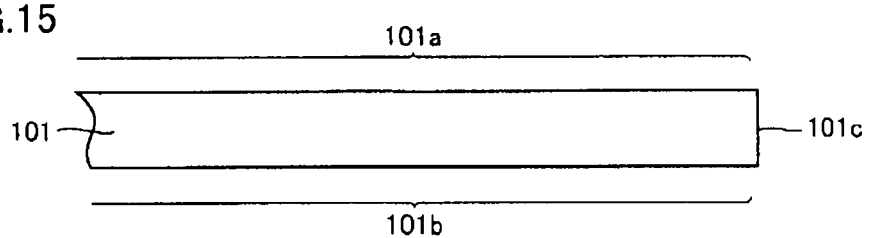
FIG. 15 is a partial cross sectional view showing a step performed after the step shown in FIG. 14.
Figure 16:
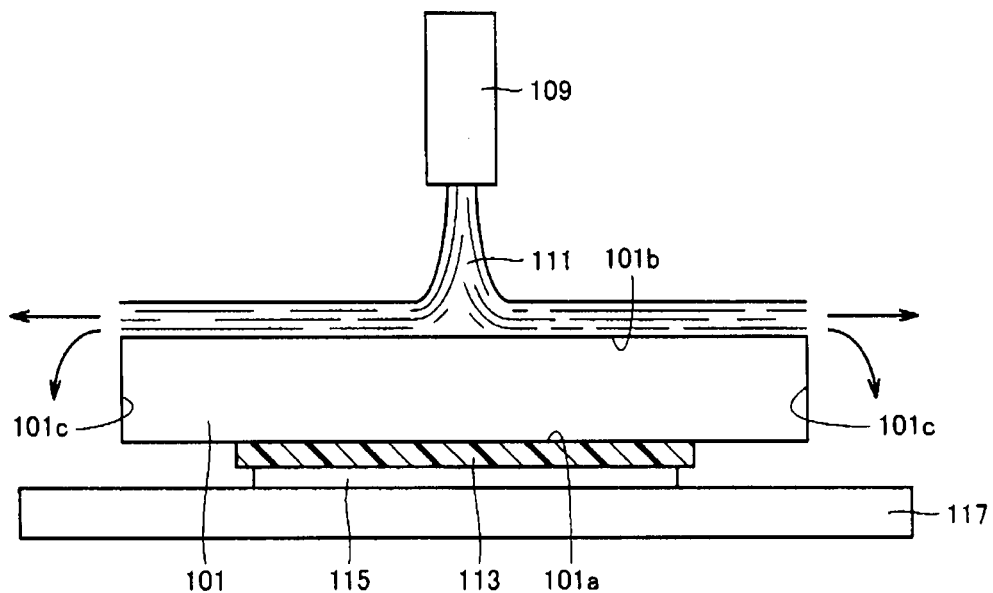
FIG. 16 is a cross sectional view showing a step performed after the step shown in FIG. 15.

Next, a portion indicated by a thickness 107 is ground from rear surface 101b of semiconductor substrate 101 as shown in FIG. 14, and the thickness of semiconductor substrate 101 is reduced to a desired thickness as shown in FIG. 15. Subsequently, a fracture layer generated by grinding rear surface 101b of semiconductor substrate 101 is removed using a mixed acid. As shown in FIG. 16, semiconductor substrate 101 is suctioned to a wafer suction portion 115 provided on a chuck stage 117, with a surface protective tape 113 being attached to front surface 101a. After the rotation speed of chuck stage 117 reaches a predetermined rotation speed, a mixed acid 111 is discharged from a chemical solution discharge nozzle 109 toward rear surface 101b of semiconductor substrate 101.

A portion of the mixed acid discharged onto rear surface 101b of semiconductor substrate 101 and flowing toward the outer peripheral end portion of semiconductor substrate 101 by centrifugal force may reach front surface 101a side of the outer peripheral end portion of semiconductor substrate 101 without being scattered, due to surface tension and gravity thereof.

Figure 17:
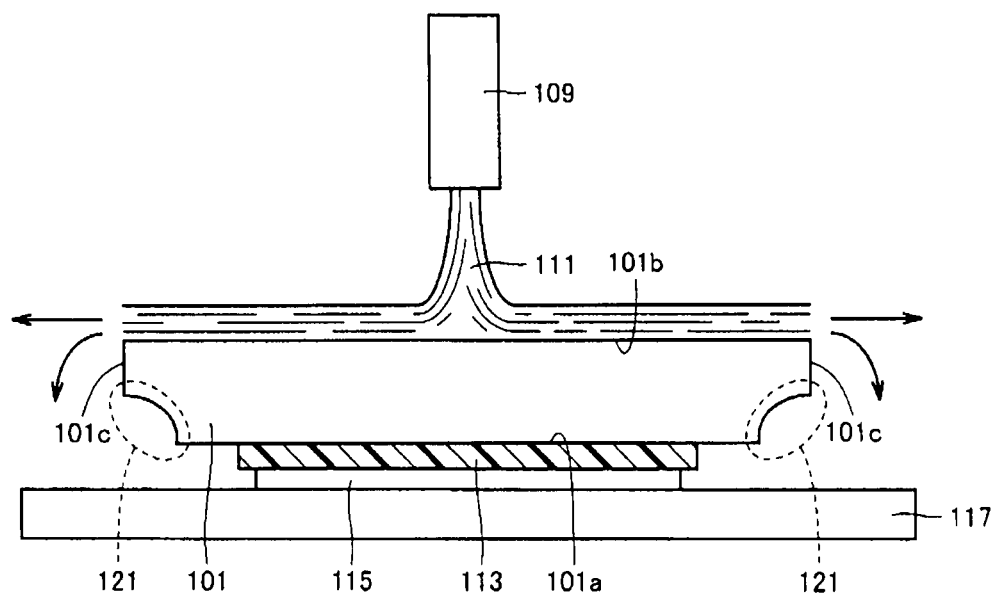
FIG. 17 is a cross sectional view showing a first state in the step shown in FIG. 16.

Surface protective tape 113 is attached to front surface 101a of semiconductor substrate 101. If protective tape 113 is ground when the outer peripheral end portion of semiconductor substrate 101 is ground, the grindstone is clogged and a grinding speed is reduced. To prevent this, protective tape 113 attached to semiconductor substrate 101 has a diameter smaller than the diameter of semiconductor substrate 101. Therefore, as shown in FIG. 17, front surface 101a side of semiconductor substrate 101 is etched as it is scooped out with the mixed acid reaching front surface 101a side from outer peripheral end surface 101c of semiconductor substrate 101 (see within a dotted line frame 121).

Figure 18:
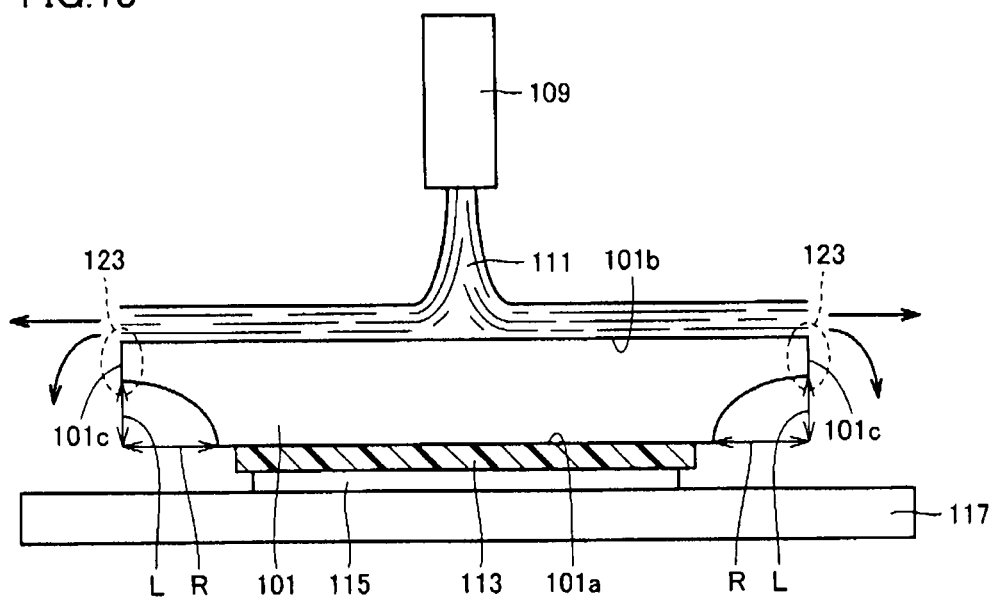
FIG. 18 is a cross sectional view showing a second state after the first state in the step shown in FIG. 16.

For example, if it is attempted to remove rear surface 101b of semiconductor substrate 101 by about 20 μm by etching using the mixed acid, a region of about 100 μm in a radial direction R and about 60 μm in a thickness direction L will be eventually removed from the outer peripheral end portion of semiconductor substrate 101, as shown in FIG. 18. Thus, the outer peripheral end portion of semiconductor substrate 101 may have a final finish shape like the edge of a knife (see within a dotted line frame 123), even though the outer peripheral end portion of semiconductor substrate 101 has been ground. Therefore, there is a high possibility that semiconductor substrate 101 may be chipped or cracked during handling and the like of semiconductor substrate 101 in subsequent steps.

In contrast, according to the method of manufacturing a semiconductor device described above, passivation film 3 is left in the shape of a ring on front surface 1a side of the outer peripheral end portion of semiconductor substrate 1. Thereby, even if the mixed acid reaches front surface 1a side from outer peripheral end surface 1c of semiconductor substrate 1, etching with the mixed acid can be blocked, preventing the outer peripheral end portion from becoming like the edge of a knife. As a result, chipping or cracking of semiconductor substrate 1 during handling and the like of semiconductor substrate 1 in subsequent steps can be reliably inhibited.

Figure 19:
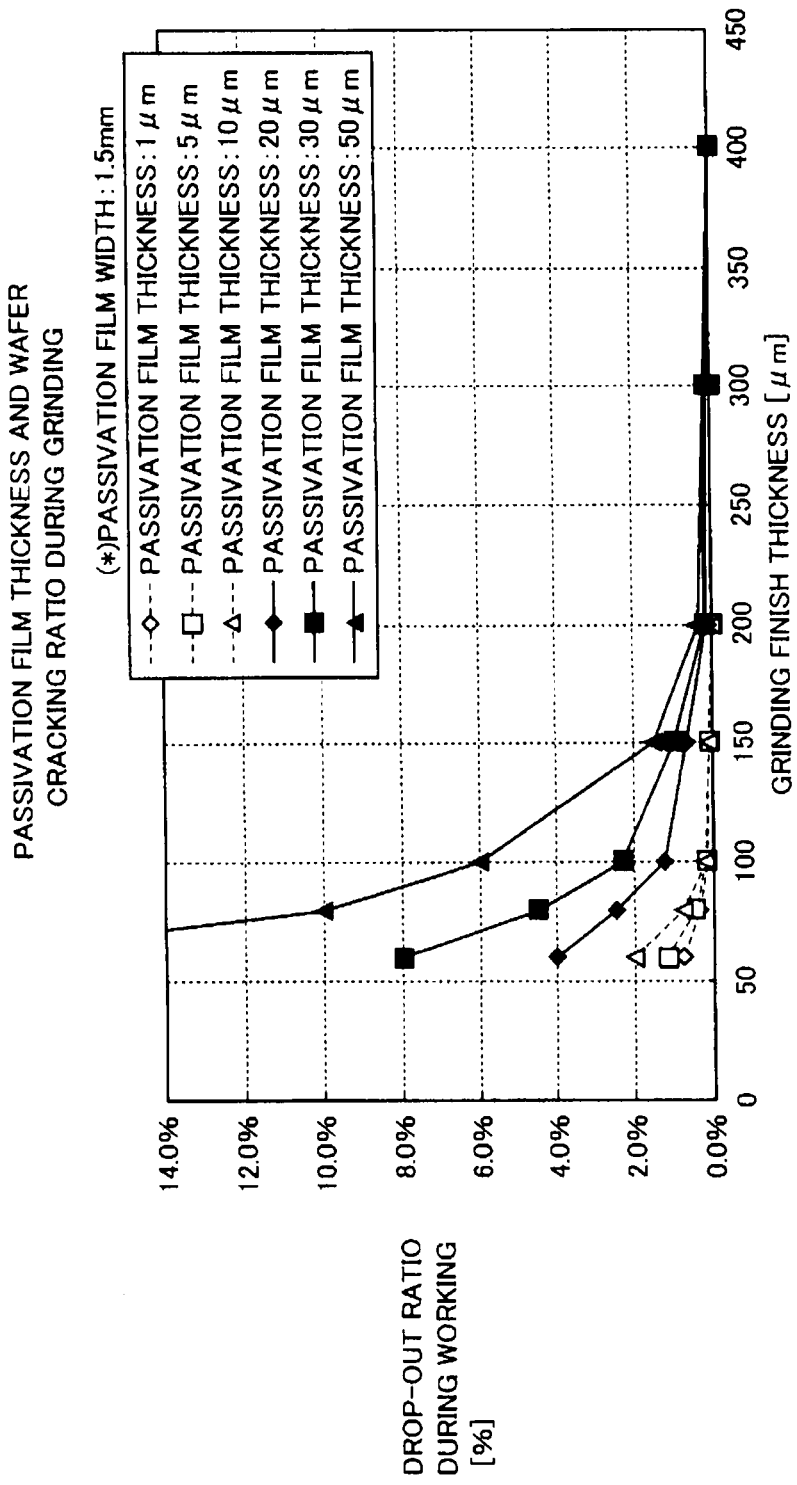
FIG. 19 is a graph showing the relationship between the film thickness of a passivation film and cracking of the semiconductor substrate in the embodiment.

Next, the relationship between a passivation film and cracking of a semiconductor substrate (wafer) evaluated by the inventors will be described. Firstly, using passivation films having a width of 1.5 mm and film thicknesses of 1 μm, 5 μm, 10 μm, 20 μm, 30 μm, and 50 μm, the rear surface of the semiconductor substrate was ground to evaluate a rate of cracking of the semiconductor substrate (a drop-out ratio). FIG. 19 shows a graph of a result of the evaluation. The axis of abscissas represents a grinding finish thickness (μm), and the axis of ordinates represents a drop-out ratio (%) of the semiconductor substrate during working.

As can be seen from FIG. 19, in the case where the film thickness of the passivation film is 1 μm, 5 μm, and 10 μm, the cracking ratio of the semiconductor substrate is extremely low until the grinding finish thickness reaches 100 μm, whereas in the case where the film thickness of the passivation film is 20 μm, 30 μm, and 50 μm, the cracking ratio starts increasing when the grinding finish thickness becomes thinner than 200 μm. Namely, although the passivation film is required to suppress the outer peripheral portion of the semiconductor substrate from having the shape of a knife, if the film thickness of the passivation film is too thick, the rate of cracking of the semiconductor substrate during grinding is increased.

From the result of the evaluation this time, it has been found that, to suppress cracking of the semiconductor substrate due to grinding while suppressing the outer peripheral portion of the semiconductor substrate from having the shape of a knife, the film thickness of the passivation film should not exceed 10 μm.

Figure 20:
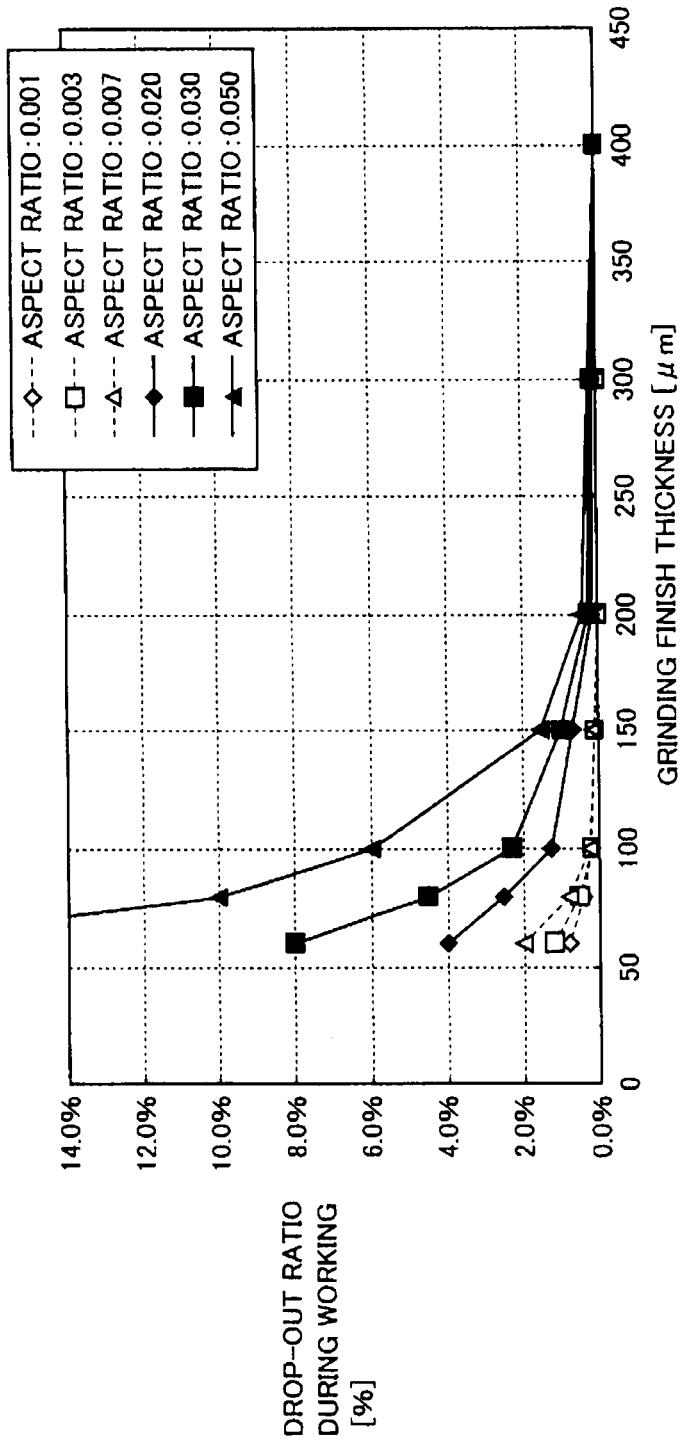
FIG. 20 is a graph showing the relationship between the aspect ratio of the passivation film and cracking of the semiconductor substrate in the embodiment.

Next, setting an aspect ratio (the film thickness of the passivation film/the film width of the passivation film) to 0.001, 0.003, 0.007, 0.020, 0.030, and 0.050, the rear surface of the semiconductor substrate was ground to evaluate a rate of cracking of the semiconductor substrate (a drop-out ratio). FIG. 20 shows a graph of a result of the evaluation. The axis of abscissas represents a grinding finish thickness (μm), and the axis of ordinates represents a drop-out ratio (%) of the semiconductor substrate during working.

As can be seen from FIG. 20, in the case where the aspect ratio is 0.001, 0.003, and 0.007, the cracking ratio of the semiconductor substrate is extremely low until the grinding finish thickness reaches 100 μm, whereas in the case where the aspect ratio is 0.020, 0.030, and 0.050, the cracking ratio starts increasing when the grinding finish thickness becomes thinner than 200 μm. Namely, although the passivation film is required to suppress the outer peripheral portion of the semiconductor substrate from having the shape of a knife, if the aspect ratio is too high, the rate of cracking of the semiconductor substrate during grinding is increased. It is to be noted that, although this graph shows a case where the film width is 1.5 mm, the same result was obtained even when the film width was changed.

From the result of the evaluation this time, it has been found that, to suppress cracking of the semiconductor substrate due to grinding while suppressing the outer peripheral portion of the semiconductor substrate from having the shape of a knife, the aspect ratio should not exceed 0.007.

Although the method of manufacturing a semiconductor device described above has been described taking the mixed acid containing hydrofluoric acid and nitric acid as an example of the chemical solution for removing the fracture layer, a chemical solution containing hydrofluoric acid, nitric acid, phosphoric acid, and sulfuric acid may be used.

The present invention is effectively utilized in a power semiconductor device.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor device, comprising the steps of:

forming a protective film from an outer end of a semiconductor substrate to an inner portion of the semiconductor substrate without extending to a center of the substrate, the protective film being formed on a first main surface of said semiconductor substrate having said first main surface and a second main surface facing each other;

forming an outer peripheral end surface orthogonal to said first main surface and said second main surface by grinding said outer end of said semiconductor substrate and grinding off at least aportion of the protective film;

reducing a thickness of said semiconductor substrate to a predetermined thickness by grinding said second main surface of said semiconductor substrate; and etching said second main surface which has been ground by discharging a predetermined chemical solution onto said second main surface while rotating said semiconductor substrate with said second main surface facing upward.

2. The method of manufacturing a semiconductor device according to claim 1, wherein said protective film is formed to have a thickness not exceeding 10 μm.

3. The method of manufacturing a semiconductor device according to claim 1, wherein a mixed acid containing hydrofluoric acid, nitric acid, phosphoric acid, and sulfuric acid is used as said predetermined chemical solution.

4. The method of manufacturing a semiconductor device according to claim 1, wherein any of a silicon nitride film and a polyimide film is formed as said protective film.

5. The method of manufacturing a semiconductor device according to claim 1, wherein, if it is assumed that a ratio obtained by dividing a film thickness of said protective film by a width of the protective film is defined as an aspect ratio, said protective film is formed to have a value of said aspect ratio not exceeding 0.007.

\* \* \* \* \*